July 8, 1958 R. J. WILLIAMS 2,842,662
FLIP-FLOP CIRCUIT
Filed Feb. 3, 1955

INVENTOR.
ROBERT J. WILLIAMS
BY Thomas B. Horton
AGENT 2,842,662
Patented July 8, 1958

2,842,662

FLIP-FLOP CIRCUIT

Robert J. Williams, Berwyn, Pa., assignor to Burroughs Corporation, Detroit, Mich., a corporation of Michigan Application February 3, 1955, Serial No. 486,004

6 Claims. (Cl. 250—27)

This invention relates to switching circuits and more particularly to flip-flop circuits.

It is well known that the usable output signal from a vacuum tube bistable state circuit or flip-flop is incapable of driving an appreciable load. Thus, a large load connected to one of the output terminals of a flip-flop circuit loads down the flip-flop so that it either functions poorly or functions not at all. In general, this problem is solved by the provision of an output circuit for the flip-flop which provides power amplification for the flip-flop output signal and which does not load down the flip-flop circuit appreciably.

Several well known flip-flop output circuits include a pulse amplifier which is controlled in part by the flip-flop output signal and in part by a periodic clock pulse. Such circuits work well at low frequencies. However, at higher frequencies because of the response time of the circuits controlling the flip-flop and because of the inherent time required to switch the flip-flop, complete switching may not be accomplished at the clock pulse time of the particular time period in which switching of the flip-flop is triggered. Hence the pulse amplifier output signal is either lost entirely or is severely mutilated. This loss or mutilation of signal may be avoided by the inclusion of a delay element between the flip-flop and the pulse amplifier whereby the flip-flop output signal produced during a particular time period is prevented from conditioning the pulse amplifier until the clock pulse for that particular time period is terminated and the succeeding clock pulse arrives. With the proper pulse, the flip-flop thereby produces a pulse amplifier output signal in response to a further clock pulse so that proper gating time is afforded to produce an undistorted output pulse.

This invention seeks to provide an improved, more efficient circuit of the sort described above.

It is an object of this invention to provide an improved flip-flop gating circuit.

According to the invention, a delay element is interposed between the output conductor of a vacuum tube flip-flop and a power amplifier which is controlled jointly by delayed flip-flop signals and clock pulses. In order to provide a good impedance match between the flip-flop and the delay element, the output conductor from the flip-flop is projected from the cathode of one of the flip-flop tubes. The delay element insures that the output signal produced by switching of the flip-flop during a particular time period does not reach the power amplifier until the clock pulse for that particular time period has terminated. The delayed flip-flop output signal and the clock pulse of the succeeding time period are then used to operate the pulse amplifier.

Other objects and advantages will become apparent when the following description is read with reference to the following drawings of which:

Figure 1:
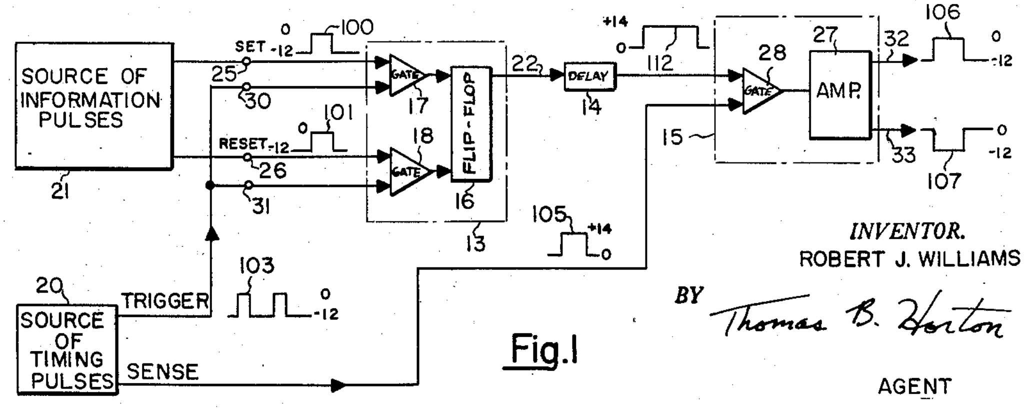
Fig. 1 is a logical diagram of the invention.

Before entering into a detailed description of the circuitry of the invention, the invention and its operation will be described generally with reference to the logical diagram of Fig. 1 and the waveforms of Fig. 3.

Broadly the invention comprises the series combination of a flip-flop circuit 13, a delay element 14 and an amplifier circuit 15.

The flip-flop circuit 13 comprises a bistable state element 16 which is set and reset under control of the coincidence gates 17 and 18, respectively. Input leads 30 and 31 of the gates 17 and 18, respectively, are commonly coupled to a source 20 of timing pulses which are effective to trigger the corresponding gate if it is properly conditioned at its other input lead. The other input lead of gate 17 is connected to the terminal 25 of a source 21 of information pulses for conditioning the gate to set the flip-flop. Similarly, the other input lead of gate 18 is connected to terminal 26 of the source of information pulses for conditioning the gate to reset the flip-flop.

Figure 3:
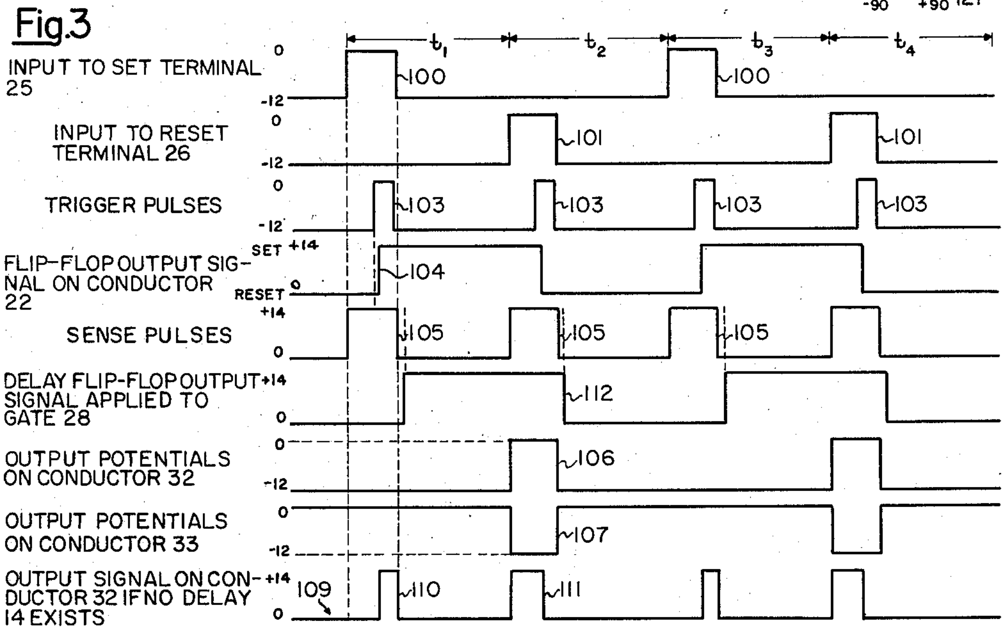
Fig. 3 is a waveform chart illustrating the operation of both Figs. 1 and 2.

The set pulses 100 and reset pulses 101 from the source 21, if present, occur at the beginning of a respective time period $t_1$ or $t_2$ as illustrated in Fig. 3, and are positive-going, two microsecond pulses rising from a quiescent level of −12 volts to a zero volt potential. The trigger pulses 103 also rise from a quiescent value of −12 volts to zero volts; however, they are only one microsecond wide. A trigger pulse 103 occurs for every time period $t$, and the trigger pulses are so spaced relative to the set and reset pulses that they coincide with the last half of set and reset pulses. Thus the application of a set or reset pulse to the appropriate gate 17 or 18 conditions the gate for switching the flip-flop 16 at the trigger pulse time. Flip-flop output line 22 assumes a +14 volt potential to indicate that the flip-flop 16 is set and assumes a zero volt potential to indicate that flip-flop 16 is reset as illustrated by waveform 104.

The delay element 14 is interposed between flip-flop circuit 13 and amplifier circuit 15 and functions to delay a change in flip-flop state from reaching the pulse amplifier until the trigger pulse which effected such change has subsided. In this instance a one microsecond delay is sufficient.

Amplifier circuit 15 comprises a normally cut off pulse amplifier 27 which is caused to conduct with a coincidence gate 28. Coincidence gate 28 is jointly controlled by the delayed flip-flop output signal from delay section 14 and by sense pulses 105 from the source 20 of timing pulses. The sense pulses 105 occur at the beginning of every time period, coincident with both the set and reset pulses, and rise from a quiescent level of zero volts to +14 volts. With coincidence gate 28 properly conditioned by a delayed flip-flop signal 112, a sense pulse 105 at the beginning of time period $t_2$ produces conduction of power amplifier 27. Power amplifier 27 operates to produce a zero volt, 2 microsecond pulse 106 on output conductor 32 and a −12 volt, 2 microsecond pulse 107 on output conductor 33. With amplifier 27 inoperative, output conductors 32 and 33 display quiescent potentials of −12 and zero volts, respectively. In this particular circuit zero volts and −12 volts are the two logical potential levels, and it is seen that output conductors 32 and 33 display the logical inversions of each other. Therefore it is only necessary to amplify the output signal produced by one of the flip-flop tubes where both such signals are necessary.

In operation, it is assumed that flip-flop 16 is reset and a set pulse 100 is applied to terminal 25 of gate 17 during the time period $t_1$. The trigger pulse 103 of the time period $t_1$ finds the gate properly conditioned for triggering flip-flop 16, and flip-flop 16 switches from its reset to its set state. In response, flip-flop output conductor 22 switches from zero volts potential to +14 volts potential. It is to be noted that, as shown by waveform 104 of Fig. 3, flip-flop 16 does not switch immediately upon the initial occurrence of the trigger pulse but switches a short time afterwards. This delay is accounted for by the time required for operation of the coincidence gate 17 and for the time required to raise the potential of the control grid of the associated flip-flop tube from a potential below cutoff up to a potential capable of effecting conduction.

Delay element 14 delays the change in flip-flop output potential approximately one microsecond so that the change is not apparent at gate 28 until the sense pulse 105 of time period $t_1$ has terminated. For the remainder of the time period $t_1$ and extending beyond sense pulse time of the time period $t_2$, the delayed flip-flop input to gate 28 assumes a +14 volt potential which conditions it for operation by the sense pulse 105 of the time period $t_2$. Therefore the sense pulse 105 of time period $t_2$ is effective to operate gate 28 to produce conduction of power amplifier 27 which lasts for the duration of the sense pulse. Operation of power amplifier 27 produces a 12 volt positive-going signal 106 which drives conductor 32 up to zero volts and a 12 volt negative-going pulse 107 which pulls conductor 33 down to −12 volts. It is to be noted that a standard two microsecond pulse rising from −12 volts to zero volts initiated the operation of the entire combination, and in response a like standard pulse 100 and its inversion are produced. In computer design it is desirable that all logical elements operate with and produce a standard pulse for the particular system in which it is utilized.

Continuing with the circuit operation, assume that a reset pulse 101 occurs at the beginning of time period $t_2$. At trigger pulse time of time period $t_2$ coincidence gate 18 having a pulse present at each of its inputs effects resetting of flip-flop 16, and output conductor 22 switches from +14 volts to zero volts potential. This change in potential is prevented by delay element 14 from reaching gate 28 of amplifier 27 until after the sense pulse 105 of time period $t_2$ has terminated. Therefore, although flip-flop 16 is switched coincidently with the operation of amplifier circuit 15 during the time period $t_2$, it has no effect upon the amplifier circuit at this time. However, because of delay 14, the flip-flop output potential produced during time period $t_2$ persists at the gate 28 through sense pulse time of the time period $t_3$. Hence the sense pulse 105 of time period $t_3$ finds coincidence gate 28 inhibited by a delayed low potential output from flip-flop 16 and no amplifier conduction occurs. Accordingly, output conductors 32 and 33 display their quiescent voltages of −12 and zero volts, respectively.

By purposely delaying the output signal of flip-flop 16 for utilization during the succeeding time period, there is no signal mutilation and an output signal having a full pulse width is produced. Waveform 109 illustrates the output signal which would be produced if the delay element 14 were not present and flip-flop 16 were connected directly to the pulse amplifier. It is seen that only a partial pulse 110 of somewhat less than a microsecond would be produced in response to the set pulse 100 of time period $t_1$ and a fairly large pulse 111 is produced in response to the reset pulse 101 during time period $t_2$ when in fact there should be no output pulse. Thus the need for delay element 14 to maintain accurate control over the waveform is clearly evident.

Figure 2:
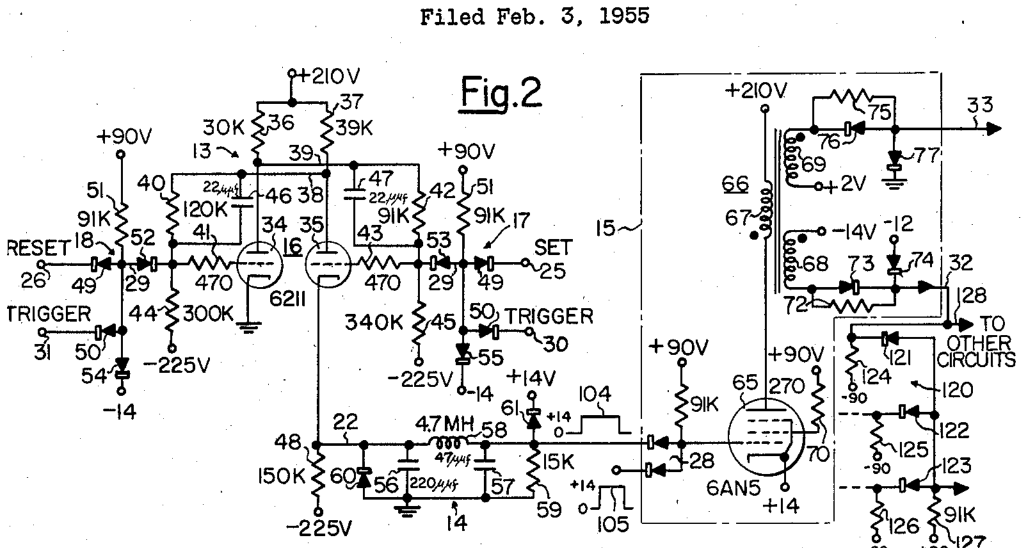
Fig. 2 is a detailed schematic wiring diagram of the invention.

Having generally described the construction and operation of the invention, the components thereof will be described in detail with reference to Fig. 2.

The entire circuit 13 comprises the vacuum tube flip-flop 16 and the gating input circuits 17 and 18. Flip-flop 16 includes the triodes 34 and 35 which have their anodes connected through load resistors 36 and 37, respectively, to a positive potential source of +210 volts. Cross connections 38 and 39 connect the anodes of the triodes respectively through resistances 40 and 41 and through resistances 42 and 43 to the opposite control grids. The control grids of triodes 34 and 35 are connected through the resistances 41 and 44 and through the resistances 43 and 45, respectively, to a negative potential source of −225 volts. In order to secure faster switching of the flip-flop, capacitors 46 and 47 are provided to by-pass the resistors 40 and 42, respectively. Resistors 41 and 43 function as parasitic suppressors. The cathode of triode 34 is connected to ground, and the cathode of triode 35 is connected through resistor 48 to a negative potential source of −225 volts. Finally a flip-flop output signal conductor 22 is projected from the cathode of triode 35.

In order to obtain the cathode output from triode 35 it is necessary to drive the control grid of triode 35 considerably more positive than is required for triode 34. Accordingly, the voltage divider circuit comprising resistors 36, 42 and 45 controlled by triode 34 is so designed that when triode 34 is cut off the proper potential level is applied to the grid of triode 35. The values for the components utilized in the described embodiment of this invention are included in the drawings.

Each of the coincidence gates 17 and 18 is comprised of a pair of diodes 49 and 50 having their anodes commonly connected through a resistor 51 to a positive source of potential, for example, +90 volts. A coincidence gate output line 29 is projected from the commonly connected diode anodes and connects the anodes; and with the input diode 52 or 53 associated with the corresponding flip-flop triodes 34 and 35. One diode of each gate 17 and 18, for example diode 50, has its cathode connected to an input terminal 30 or 31 which is supplied with the trigger pulses 103 described hereinabove. The cathode of diode 49 of gate 17 is coupled to an input terminal 25 to which are applied the signals 100 for setting the flip-flop. Similarly, diode 49 of coincidence gate 18 has its cathode connected to an input terminal 26 to which are applied signals 101 for resetting the flip-flop. Finally, coincidence gates 17 and 18 are coupled to the grid circuits of triodes 34 and 35, respectively, via the input diodes 52 and 53.

In order to further increase the speed of operation of the flip-flop 16, the anodes of each of the input diodes 52 and 53 are clamped through diodes 54 and 55 respectively to a −14 volts source. By this means the grid of the non-conducting flip-flop triode can only go 14 volts negative instead of considerably more negative as it normally would. Therefore less time is required to raise the grid of the non-conducting triode sufficiently positive for it to conduct.

The delay line 14 is a pi-section delay circuit including capacitors 56 and 57, inductance 58, and terminating resistor 59. With the values shown a one microsecond delay is provided by delay line 14 for the flip-flop output signals. Clamping diodes 60 and 61 limit the lower level of the output signal, where triode 35 is cut off, to ground potential and the higher level of the output signal, where triode 35 is conducting, to +14 volts.

Efficient overall circuit operation is obtained by the provision of the cathode follower output from the flip-flop 16. In addition to providing the proper D. C. output voltage level, it provides an output impedance which closely matches the input impedance of the delay line to provide a more efficient transfer of power.

Pulse amplifier circuit 15 comprises a pentode 65 for driving the primary winding 67 of a pulse transformer 66 having a pair of secondary windings 68 and 69. Pentode 65 has its screen grid connected through a resistor 70 to a suitable source of positive potential and its suppressor grid and cathode commonly connected to +14 volts. A coincidence gate 28, which is similar to the gates 17 and 18, has its output connected to the control grid of pentode 65. The two signal inputs to coincidence gate 28 are the delayed flip-flop signal 104 and the sense pulses 105. If both of the inputs are at +14 volts potential, gate 28 drives the control grid of pentode 65 positive enough with respect to its cathode to cause pentode 65 to conduct. Conduction in pentode 65 produces current flow in primary winding 67 of transformer 66 and induces a positive-going signal at terminal 32 from the secondary winding 68 and a negative-going signal at terminal 33 from the secondary winding 69. Secondary winding 68 is connected at its one end to —14 volts and at its other through a resistor 72 and a diode 73 in parallel to output conductor 32 which is clamped by diode 74 to —12 volts. With pentode 65 cut off the output conductor 32 displays its clamped value of —12 volts; however, with pentode 65 conducting output line 32 is raised to zero volts potential. Secondary winding 69 is connected at one end to a potential of +2 volts and at its other end through resistor 75 and diode 76 in parallel to the output conductor 33 which is clamped by diode 77 to ground potential. Therefore, with pentode 65 cut off the output conductor 33 displays its clamped value of zero volts; however with pentode 65 conducting output conductor 33 is pulled down to —12 volts.

With pentode 65 non-conducting, current flows in the series path from the —14 volt potential source at the upper end of secondary winding 68 through the winding 68, resistor 72, and diode 74 to the —12 volt source. This two volt potential difference provides a threshold voltage which serves to eliminate noise and transient signals at output conductor 32. It is evident from the drawings that a similar function is performed by the circuitry associated with secondary winding 69. The combination of resistor 72 and diode 74 serves to provide critical damping for the secondary winding 68 and thereby prevent ringing in the winding. The combination of resistor 75 and diode 76 perform the identical function for secondary winding 69. Additionally the diodes 73 and 76 provide a low impedance path for the output signals between their associated windings 68 and 69 respectively and output conductors 32 and 33. Finally, resistors 72 and 75 function to provide a path for excessive currents which might inadvertently or accidentally be applied to the diodes 73 and 76 by malfunctioning of the load circuits coupled to leads 32 or 33.

In this particular instance the output conductor 32 is connected to the cathode of the input diode 121 of a diode "and" gate 120. The other input diodes 122 and 123 are connected to and controlled by other circuits not shown which may be, but are not necessarily restricted to, circuits which are similar in type to the pulse amplifier 15. The anodes of all of the "and" gate diodes are commonly connected through a resistor 127 to a source of +90 volts, and an output line is projected from the commonly connected anodes. The cathodes of each of the diodes 121, 122, and 123 are further connected through the resistors 124, 125, and 126, respectively to sources of —90 volts. Assume for the moment that all of the "and" gate diodes are conducting and that the current flowing through the resistor 127 divides equally, or substantially so, among the three diode paths 121, 122, and 123. A current path exists from the —12 volt source through the diode 74 and the resistor 124 to the —90 volt source. A current path also exists from the +90 volt source through the diode 121 and the resistor 124 to the —90 volt source. Assume now that the circuits controlling the diodes 122 and 123 suddenly effect cutoff of the diodes 122 and 123. The entire current load flowing through resistor 127 is suddenly forced to flow through the single diode 121. The change in the amount of current flowing through the diode 121 and the resistor 127 effects a compensating change of current flow from the —12 volt source through the diode 74. If, however, the diode 74 and the —12 volt source were omitted, the current would be drawn from the —14 volt source, and the change in current through the inductance 68 would cause a noise pulse to be induced therein. This noise pulse may be detrimental to the operation of other circuits coupled to the output conductor 32 by the conductor 128. Thus, it is seen that the diode 74 which clamps the output line 32 to the —12 volt source also performs a noise reducing function.

Because a description of the sources of timing pulses and information pulses is unnecessary to an understanding of the invention no details of the sources have been included. However, for example, the source of information pulses might be a computer component of one sort or another, and the timed pulses may be derived from an amplifier and shaping circuit which is driven by the timing track of a magnetic drum.

It is seen from the foregoing description of the invention that a novel flip-flop output circuit is provided exhibiting features of advantage over the prior art devices. Having therefore described the invention and its mode of operation, those features of novelty believed descriptive of the nature and scope of the invention are described with particularity in the appended claims.

What is claimed is:

1. The combination of a source of periodic clock pulses each of which marks the beginning of a specified time interval, a bi-stable flip-flop including a pair of cross-connected vacuum tubes one of which has a flip-flop output conductor projected from its cathode, means operable during a first clock pulse period during said time interval for setting the flip-flop, means operable during a second clock pulse period during a further time interval for resetting the flip-flop, a pulse amplifier comprising a transformer having a primary winding and at least one secondary winding utilized as output signal means, a normally nonconducting amplifier tube connected for energizing the primary winding of the transformer, gating means for effecting conduction in the amplifier tube, means including a delay line section coupling the flip-flop output conductor with the gating means, said delay line providing a delay for flip-flop output signals which lasts beyond the first clock pulse period, and means coupling said gating means and the clock pulse source to cause the second clock pulse to trigger the gating means for effecting conduction of the amplifier tube when the gate is properly conditioned by the delayed flip-flop output signal.

2. The combination of a source of periodic clock pulses each of which marks the beginning of a time interval, a bi-stable flip-flop including a pair of cross-connected tubes one of which has a flip-flop output conductor projected from its cathode, means operable during a clock pulse period of a time interval for setting the flip-flop, means operable during a clock pulse period of a time interval for resetting the flip-flop, a pulse amplifier comprising a transformer having a primary winding and at least one secondary winding utilized as output signal means, a normally non-conducting amplifier tube for energizing the primary winding of the transformer, gating means for effecting conduction in the amplifier tube, means including a delay line section coupling the flip-flop output conductor with the gating means, said delay line providing a delay for flip-flop output signals which is long compared to a clock pulse but is short compared to a time interval, and means coupling said gating means and the clock pulse source to cause the clock pulse to trigger the gating means for effecting conduction of the amplifier tube when the gate is properly conditioned by the delayed flip-flop output signal.

3. The combination of a source of periodic sense pulses each marking the beginning of a time interval, a flip-flop comprising a first vacuum tube having at least an anode, a control electrode, and a cathode, a second vacuum tube having at least an anode, a control electrode, and a cathode, means linking the control electrode of the first tube with the anode of the second tube, means linking the control electrode of the second tube with the anode of the first tube, a flip-flop output conductor projected from the cathode of one of the flip-flop tubes, means operable during the sense pulse period of a time interval for setting the flip-flop connected to the control grid of the first flip-flop tube, means operable during the sense pulse period of a time interval for resetting the flip-flop connected to the control grid of the second flip-flop tube, a pulse amplifier comprising a transformer having a primary winding and at least one secondary winding which is utilized as output signal producing means, a normally nonconducting amplifier tube having its output electrode connected for energizing the primary winding of the transformer, gating means linked to the control electrode of the amplifier tube for effecting conduction of the latter, means coupling the gating means with the source of sense pulses, and means including a delay line coupling the flip-flop output conductor with the gating means, said delay line providing a delay which is long with respect to a sense pulse but short with respect to the time interval, whereby the sense pulse triggers the gating means to effect conduction of the amplifier tube if the gating means is properly conditioned by the delayed flip-flop output signal.

4. The combination according to claim 3 and including diode clamping means applied to the control grids of each of the flip-flop tubes to limit the negative potential assumed by the grid of the cutoff flip-flop tube.

5. The combination according to claim 4 wherein the means for setting the flip-flop and the means for resetting the flip-flop both are coincidence gates, and including a source of information signals coupled to each of the gates, and a source of timed pulses coupled to each of the gates, whereby a coincidence gate is operated upon the coincident application thereto of an information signal and a timed pulse.

6. The combination according to claim 5 and including damping means and clamping means coupled to the secondary winding of the transformer.

References Cited in the file of this patent

UNITED STATES PATENTS

| | | |
|---|---|---|
| 2,211,942 | White | Aug. 20, 1940 |
| 2,298,083 | Fyler | Oct. 6, 1942 |
| 2,458,574 | Dow | Jan. 11, 1949 |
| 2,546,371 | Peterson | Mar. 27, 1951 |
| 2,712,065 | Elbourn et al. | June 28, 1955 |
| 2,715,997 | Hill | Aug. 23, 1955 |
| 2,750,499 | Newman et al. | June 12, 1956 |
| 2,788,442 | Smith | Apr. 9, 1957 |